(12) United States Patent
Dannels

(10) Patent No.: US 9,983,283 B2
(45) Date of Patent: May 29, 2018

(54) ACCELERATED MRI USING RADIAL STRIPS AND UNDERSAMPLING OF K-SPACE

(71) Applicant: Toshiba Medical Systems Corporation, Tochigi (JP)

(72) Inventor: Wayne R. Dannels, Mentor, OH (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 706 days.

(21) Appl. No.: 14/659,166

(22) Filed: Mar. 16, 2015

(65) Prior Publication Data

US 2016/0274209 A1    Sep. 22, 2016

(51) Int. Cl.
*G01R 33/561* (2006.01)
*G01R 33/36* (2006.01)
*G01R 33/48* (2006.01)
*G01R 33/385* (2006.01)
*G01R 33/56* (2006.01)

(52) U.S. Cl.
CPC ...... *G01R 33/4824* (2013.01); *G01R 33/5608* (2013.01); *G01R 33/5611* (2013.01); *G01R 33/5617* (2013.01)

(58) Field of Classification Search
CPC ................... G01R 33/48–33/586; G01V 3/14
USPC ........... 324/300–322; 600/410–421; 382/131
See application file for complete search history.

(56) References Cited

U.S. PATENT DOCUMENTS

| | | |
|---|---|---|
| 7,023,207 B1 | 4/2006 | Gaddipati et al. |
| 7,102,348 B2 | 9/2006 | Zhang et al. |
| 7,372,269 B2 | 5/2008 | Takizawa et al. |
| 7,382,127 B2 | 6/2008 | Gaddipati et al. |
| 7,482,806 B2 | 1/2009 | Stemmer et al. |
| 7,535,222 B2 | 5/2009 | Bammer et al. |
| 7,538,549 B2 | 5/2009 | Takei |
| 7,619,410 B2 | 11/2009 | Beatty et al. |
| 8,405,394 B2 * | 3/2013 | Doyle ................ G01R 33/4824 324/309 |
| 2009/0129648 A1 | 5/2009 | Arfanakis et al. |
| 2014/0111203 A1 | 4/2014 | Zhou |

* cited by examiner

*Primary Examiner* — Melissa Koval
*Assistant Examiner* — Rahul Maini
(74) *Attorney, Agent, or Firm* — Nixon & Vanderhye P.C.

(57) ABSTRACT

Magnetic resonance imaging (MRI) systems and methods to effect accelerated MR image reconstruction for undersampled data acquisitions with radial strip acquisitions of k-space are described. The improved MR image reconstruction is performed by acquiring k-space data in accordance with a data acquisition pattern which comprises a plurality of strips leaving a plurality of undersampled areas therebetween that do not have another undersampled area in a diametrically opposed position of k-space. The acquired k-space data is then used to generate an MR image.

20 Claims, 7 Drawing Sheets

ACCELERATED MRI USING RADIAL STRIPS AND UNDERSAMPLING OF K-SPACE

FIELD

The subject matter below relates generally to magnetic resonance imaging (MRI), and more particularly to systems and methods for acceleration of radial strip scan techniques such as, for example, Periodically Rotated Overlapping Parallel Lines with Enhanced Reconstruction (PROPELLER), having undersampled k-space.

DETAILED DESCRIPTION

Figure 1:
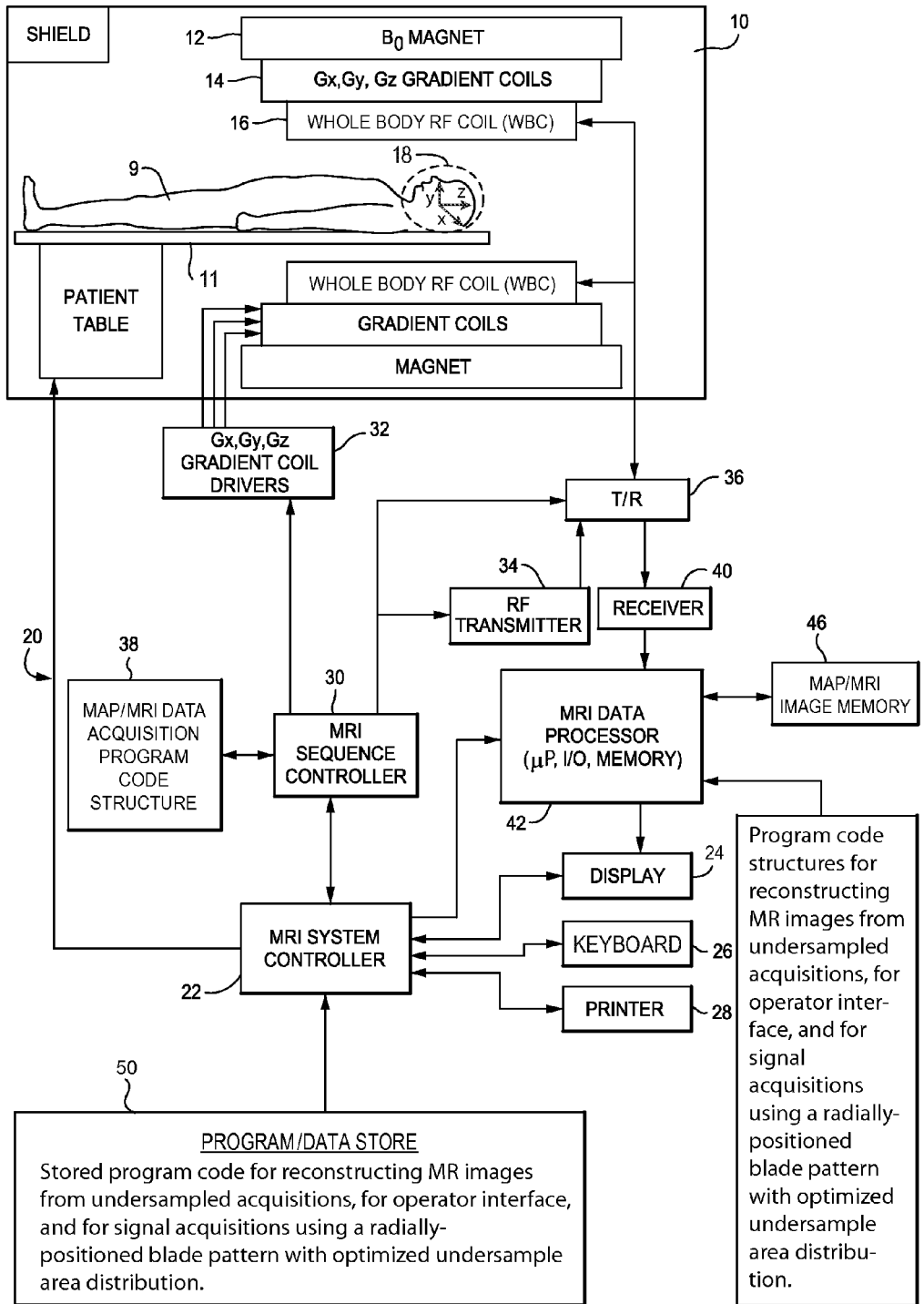
FIG. 1 is a high-level schematic block diagram of an MRI system adapted for acceleration of radial strip scan techniques such as PROPELLER, having undersampled k-space, in accordance with one or more embodiments.

Example embodiments of the subject matter disclosed herein provide for acceleration of radial strip scan techniques with undersampled k-space. In embodiments, k-space data is acquired by an accelerated scan according to a pattern that optimizes undersampled areas of k-space such that image reconstruction may be performed with reduced artifacts.

Embodiments of the subject matter disclosed herein operate to improve the speed of scanning and/or the quality of MR images obtained from undersampled k-space data acquired using radial strip scan techniques such as, but not limited to, Periodically Rotated Overlapping Parallel Lines with Enhanced Reconstruction (PROPELLER) or other techniques that obtain data along radial strips in k-space instead of in Cartesian trajectories. PROPELLER is advantageous for reducing many kinds of motion artifacts. PROPELLER techniques are also known by various other names, such as, for example, JET™ (e.g., in relation to MRI equipment from Toshiba), BLADE™ (e.g., in relation to MRI equipment from Siemens), Multi-Vane™ (e.g., in relation to MRI equipment from Philips), and RADAR™ (e.g., in relation to MRI equipment from Hitachi).

PROPELLER includes sampling k-space by rotating a set of radially arranged strips. Each radial strip includes a plurality of parallel phase-encoded lines that are read out according to a predetermined RF pulse echo sequence. PROPELLER operates by acquiring k-space data for a predetermined number of radial strips in a first shot, rotating the set of radial strips by a predetermined rotation angle, taking a second shot using the rotated set of radial strips, and repeating the process until the entire (or substantially the entire) k-space, in this case an area in substantially the shape of a circle around a center (e.g. k-space center) defined by the rotating set of radial blades, is sampled.

The PROPELLER trajectories are not purely radial, in that the trajectory lines differ both by an angle and by a perpendicular offset from a center point. A specific aspect of PROPELLER sequence, its acquisition, and its reconstruction may be more closely tied to the angular steps, or to the Cartesian phase encode displacement within one angled blade. Thus, calling PROPELLER 'radial' may not always be ideally descriptive of a detail in PROPELLER. As one considers the number of distinct lines needed to provide satisfactory coverage around the perimeter of a roughly circular k-space area, in this specification, the term 'radial' is used as being the generally descriptor for such coverage, especially at the perimeter of the k-space region. The 'radial' term is used herein to emphasize that k-space lines may end all along the perimeter of a collected k-space, in distinction to the common "Cartesian phase encoded k-space", where lines of acquired data generally terminate on two opposed sides of a rectangular region, but not on the other two sides. Herein, the word 'radial' is not used in the alternative meaning, that trajectories vary only in terms of angular rotations about a central point.

PROPELLER is often performed with an underlying Fast Spin Echo (FSE) sequence. Clinical situations where it can have very significant advantage in terms of image quality include uncooperative patients (e.g., children, or adults with dementia), anatomical areas with high motion (e.g., liver, and fetal imaging), sequences with high intrinsic motion sensitivity (e.g., diffusion), or areas where motion artifacts are typically more significant (e.g., cervical spine), or where susceptibility distortion would otherwise be unacceptable (e.g., high resolution diffusion echo planar imaging). PROPELLER can be substantially immune to certain motions of the scanned subject because each TR can be corrected in accordance with amount of positional displacement particular to that time within the longer acquisition, perhaps by correcting each individual blade to better match an average position.

Among PROPELLER sequences, most often, the echo sequence uses FSE (fast spin echo) echo trains or GRASE (gradient and spin echo) echo trains, relying at least in part on generation of RF refocused spin echoes. But examples of PROPELLER sequences are also known where the lines within a radially oriented blade are acquired using gradient refocused echoes.

A key disadvantage of PROPELLER is that it is slower than many other methods with the same spatial resolution. This is related to the fact that PROPELLER naturally oversamples the center of k-space. This oversampling is a major reason why PROPELLER has good motion properties. It allows for averaging of certain kinds of motion, at least in central k-space. And it allows for comparison of central k-space data from successive TR's, which in turn allows detection of motion, and correction of several kinds of motion (e.g., some rotations or translations).

PROPELLER can be used to correct for gross anatomical displacements, especially in-plane motions with respect to 2D mufti-slice acquisition. It can also contribute to improved data consistency when multiple shots are needed for higher resolution. For example, when diffusion weighting would normally create shot-to-shot major variations in signal phase, the use of PROPELLER may result in a higher level of consistency. PROPELLER has yet other advantages, such as comparatively benign artifacts due to off-resonance, etc. Although it has many clinically useful advantages as noted above, radial acquisitions often entail some form of angular undersampling in order to shorten the acquisition time due to patient comfort and other factors. PROPELLER can exhibit this. In PROPELLER, while peripheral portions of a k-space region may be undersampled, other interior portions of the acquired k-space may be either oversampled or sampled critically.

In MRI sequences, k-space samples are undersampled, oversampled, or critically sampled, at least along a given direction, by virtue of the density of samples relative to the Nyquist criterion for the intended image's FOV (field of view). In PROPELLER however, this sampling can be described in another useful way. Routinely, one blade may exhibit critical sampling in k-space, for the region of k-space which the blade covers. Then, any given location in k-space can be described as undersampled, oversampled, or critically sampled depending on the number of blades which contribute data in that vicinity of k-space. By that criterion, a small region of k-space is oversampled if two or more blades provide data spanning that small region. A small region is critically sampled if only one blade contributes data there. A small region of data is undersampled (or "unsampled") if no blades acquire k-space data for that region. Thus, oversampling is associated with overlap of blade coverage from multiple blades in k-space, etc.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body radio frequency (RF) coil (WBC) assembly 16. Along the horizontal axis of this cylindrical array of elements is an imaging volume 18 shown as substantially encompassing the anatomy of interest for a patient 9 supported by a patient table 11.

In some embodiments, a smaller array RF coil (not shown) might be coupled to a portion of the patient such that the imaging volume would include the area encompassed by the smaller array RF coil. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and one or more receiver coils configured to receive RF signals from the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22, or a computer coupled to the MRI system controller 22, may be operated to provide the MRI sequence controller 30 information about a pulse sequence and/or to manage the operations of the entire system, according to installed software programs. The MRI system controller 22 may also serve as an element for instructing a patient to perform tasks, such as, for example, a breath hold by a voice message produced using an automatic voice synthesis technique.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques. The MRI imaging techniques may include, for example, parallel imaging and/or other imaging sequences.

The pulse-sequence information includes information required for operating the Gx, Gy and Gz gradient coil drivers 32, as well as the RF transmitter 34 and the transmit/receive switch 36 (if the same RF coil is used for both transmission and reception) according to a pulse sequence. Such information includes the strength, duration, and application timing of pulsed currents applied to the x-, y-, and z-coil. A duty cycle or TR is also controlled by the system controller 22 and/or sequence controller 30. The transmission of pulse sequences, duty cycle etc. may be controlled by the MRI system controller 22, MRI sequence controller 30, and/or MRI data processor 42 based on, for example, program code for a signal acquisition pattern such as, for example, radial acquisition such as, but not limited to, PROPELLER.

The MRI system 20 includes an RF receiver 40 providing input to data processor 42 which uses that input to create processed image data, which is sent to display 24. The MRI data processor 42 is also configured for access to system configuration parameters 46, program code structures 44 and program/data store 50. MRI program code structures 44 and 50 may, in addition to control logic for reconstructing MRI images, also include control logic to obtain MR data from RF coils 16 and/or any other receive coils. Processes such as, for example, processes 800 and 900 described below in relation to FIGS. 8 and 9, respectively, can be performed by the MRI system controller 22, MRI sequence controller 30, and/or MRI data processor 42.

Although shown in FIG. 1 as being located away from the RF coil 16, in some embodiments, any of RF transmitter 34, transmit/receive switch 36, and RF receiver 40 may be located in close proximity to, or on a surface of, the RF coils 16 and/or other RF coil.

Also illustrated in FIG. 1 is a generalized depiction of an MRI system program/data store 50 where stored program code structures (e.g., for controlling data acquisition according to radial strip scan techniques, for improved image reconstruction for undersampled k-space acquisitions, for defining graphical user interfaces (GUI), accepting operator inputs), and configured or predetermined data (e.g., certain threshold settings for controlling program execution, parameters for controlling the joint estimation of coil sensitivity and image reconstruction by compressed sensing) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a coil sensitivity map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

Figure 2:
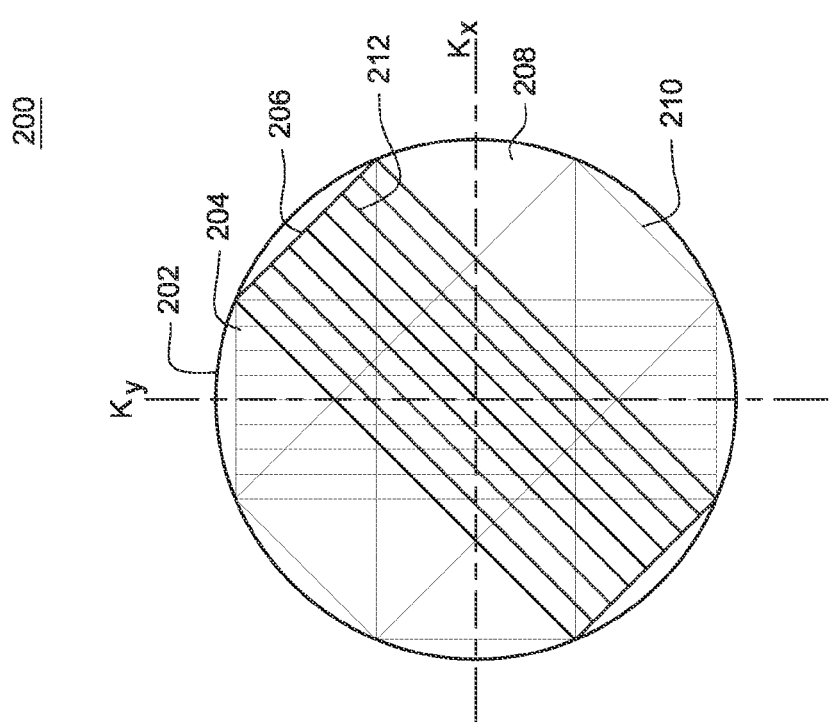
FIG. 2 illustrates a blade arrangement pattern according to a conventional PROPELLER technique.

FIG. 2 illustrates an example data acquisition pattern 200 used in a conventional PROPELLER scan. The figure schematically illustrates a substantially circular area 202 of k-space that may correspond to k-space populated by data acquired by a scan of an axial slice of the brain of a patient. In the conventional technique shown in FIG. 2, the PROPELLER strips (also sometimes referred to herein as "blades", "radial strips" or "strips") are arranged such that the substantially circular area in k-space, that is to be transformed into an image, does not have any angular (e.g., wedge-shaped) undersampled areas between adjacent blades. For example, the strips can be arranged such that the top-right edge of one strip is flush with the top-left edge of another strip at or very near the perimeter of the circular area, so that no angular gaps (e.g., the above referred to "angular undersampled areas") exist between any pair of immediately adjacent strips. Although there are other unsampled areas between the short edges of the rectangular strips and the perimeter of the circle 202, those are considered insignificant because of their relatively small area and because of their location far from k-space center, and because the construct of the circular area 202 itself is somewhat artificial and non-essential. There is nothing fundamentally wrong with collecting data in a relatively regular shape of k-space, such as a regular polygon. In the illustrated example, a total of 4 strips is used to image the substantially circular area 202 of k-space. Each strip 204, 206, 208 and 210 is a rectangular shape. Each strip comprises a plurality of data collection lines (e.g., 212) that are parallel to the long axis of the strip. For example, in order to acquire k-space data corresponding to strip 206, data will be acquired along a plurality of parallel lines such as lines 212 along the length direction of strip 206. In typical implementations, a first "shot" or TR of FSE collects data for strip 204, and a second shot or TR collects data for strip 206, and so on. Collecting data for a strip includes collecting data for each of the parallel data collection lines in that strip.

Figure 3:
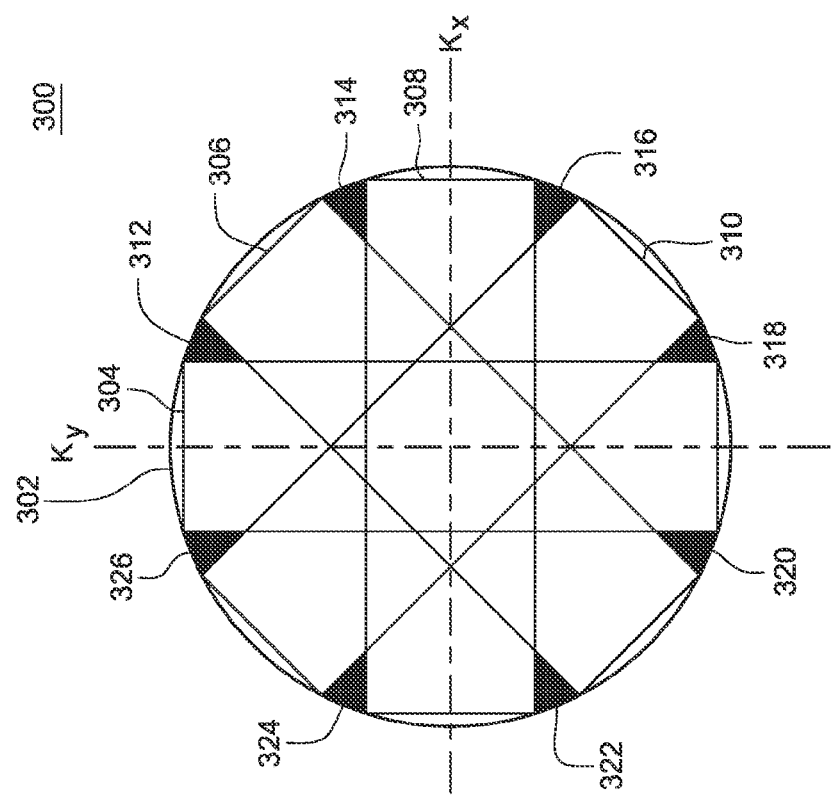
FIG. 3 illustrates a blade arrangement pattern and distribution of undersampled areas according to a conventional accelerated PROPELLER technique.

Previous techniques have attempted to accelerate the PROPELLER technique shown in FIG. 2 by using an arrangement of the strips as shown in FIG. 3. In the arrangement 300, the 4 strips are arranged such that uniform angular gaps exists between immediately adjacent strips. Each angular gap, or angular unsampled area, represents an area of k-space that is left unsampled when scanning the area 302 along the strips. The speed of data acquisition is improved (e.g., made faster) because, for example, in the pattern 300 shown in FIG. 3, the angular unsampled areas are not sampled in order to obtain data thus reducing the area in k-space for which data must be collected.

In the illustrated example, the 4 strips are arranged such that 8 angular unsampled areas 312-326 are formed. If other numbers of strips are used, the number of angular unsampled areas will also change. For example, if n strips are used to scan a substantially circular area 302 in an accelerated manner, then an even number 2n of angular undersampled areas are formed. When 2n angular unsampled areas are formed across 360 degrees using n strips, and when strips are centered symmetrically about the center of the k-space circle, then whenever there is an angular unsampled area at angle α there must be an angular unsampled area at angle α+180 degrees. For example, wedges 312 and 320 are diametrically opposite each other (i.e., across a diameter of the circular area being scanned). Expressed differently, wedges 312 and 320 are 180 degrees apart.

However, such conventional techniques for accelerating PROPELLER create streak artifacts (e.g., referred to as streaking) that are often unacceptable in MRI images. The reason for streak artifacts is that each angular unsampled area is directly opposite (e.g., diametrically opposite) another wedge-shaped unsampled area. When an unsampled area has another unsampled area in the diametrically opposed position, those unsampled areas cannot be accurately populated relying upon k-space symmetry, and consequently streak artifacts are formed in the resulting images.

Various reconstruction algorithms are well known in MRI for dealing with missing data. The simplest method, and the easiest to analyze method, assigns zero values to data in locations of k-space have no corresponding measured samples, or at least no samples in a vicinity on the order of the Nyquist critical sampling spacing for the scan. This is often referred to a "zero-filling reconstruction." Such methods, although simple, introduce point-spread artifacts which can be substantial.

Superior, more effective reconstruction methods generally make use of acquired data from the diametrically opposed area of k-space. That acquired data might be used either directly or indirectly. But when missing data cannot be augmented through use of the opposite data, artifacts appear. These artifacts often take on the characteristics of point spread functions, where the point spread function is fundamentally the Fourier transform of the area (or shape) of the available k-space data (acquired plus mathematically synthesized data). Point spread functions associated with very simple regular shapes like circles provide very benign artifacts, or point spreads that are not perceived as artifacts at all. Point spread functions associated with more complicated shapes are generally much more unacceptable, such as how missing wedges in k-space generate distant and often intense streak-like structures in the corresponding reconstructed image.

Therefore, despite various conventional acceleration techniques, PROPELLER remains slow, or at least slower when compared to many of the other k-space trajectories, such as the commonly-used two-dimensional Fourier Transform (2DFT) Cartesian phase-encoding methods. Some of this relative slowness can be attributed in part to lower flexibility of the sequence with respect to reduced phase-encoding and asymmetric resolution, or rejection of aliases from signal outside of the field of view (FOV), or the reduced effectiveness of techniques to obtain rectangular FOV images, or ability to maximally make use of the best spatial direction sensitivity to parallel imaging coil patterns. Some of the relative slowness can also be because, in most proposed PROPELLER accelerations, a corresponding acceleration can be applied to Cartesian techniques, which often works as well or better for Cartesian methods.

Some of the slowness may also be due to practical considerations needed to maintain the scan sequences' ability to correct certain motions (such as, for example, the degree of partial Fourier on any given strip costs progressively more in terms of ineffectiveness to deal with rotational motion in diffusion weighted scans). Some acceleration techniques may introduce additional processing and estimation, which can perhaps lead to additional artifacts, or degraded performance in the rejection of motion errors, or loss of signal to noise ratio (SNR), or the like. In general, many MR physicists consider radial acquisitions to require π/2 (about 1.57) times as many angular steps to cover the perimeter of a circle of k-space, compared to the number of parallel acquisition lines in a Cartesian phase-encoded scan covering a comparable square area of k-space. Although this may not be an exactly an apples-to-apples comparison, it illustrates an issue for radial or near-radial k-space patterns.

Thus, the problem remains, that while PROPELLER is favorable for many kinds of motion correction, even when it has been enhanced by various conventional acceleration techniques, it still compares unfavorably in terms of scan time versus non-PROPELLER scans (often non-PROPELLER scans which have also been accelerated in the same ways, or in yet more ways). The increased scan time for the same resolution remains a deterrent to the clinical use of PROPELLER.

Embodiments disclosed herein allow for sections of unsampling between radial strips of scanned areas, while also providing an improved capability for removing undersampling artifacts, particularly with respect to use of partial Fourier techniques, such as POCS (Projection onto Convex Sets) reconstruction. The example embodiments collect data with radial acquisition areas having angular gaps, or "wedges", where data is left unsampled, but places those wedges in a way that does not create diametrically opposed pairs of missing data located directly across from one another on opposite sides of the center of k-space. If data is missing on one side of k-space, but if the corresponding data is available in the corresponding location of k-space reflected across the k-space center, then reconstruction corrections become more viable because of a greatly improved ability to accurately "fill-in" the missing k-space data.

To improve the performance of PROPELLER, various conventional techniques have explored the sizing and composition of each blade (such as partial Fourier, or parallel imaging with autocalibration), and the preferred orders for collecting data from blades, with varying levels of success. However, the conventional techniques do not describe collecting data where blades are shifted differently, or where angulation of blades are non-uniform, or where gaps are positioned optimally as in the example embodiments herein.

Figure 4:
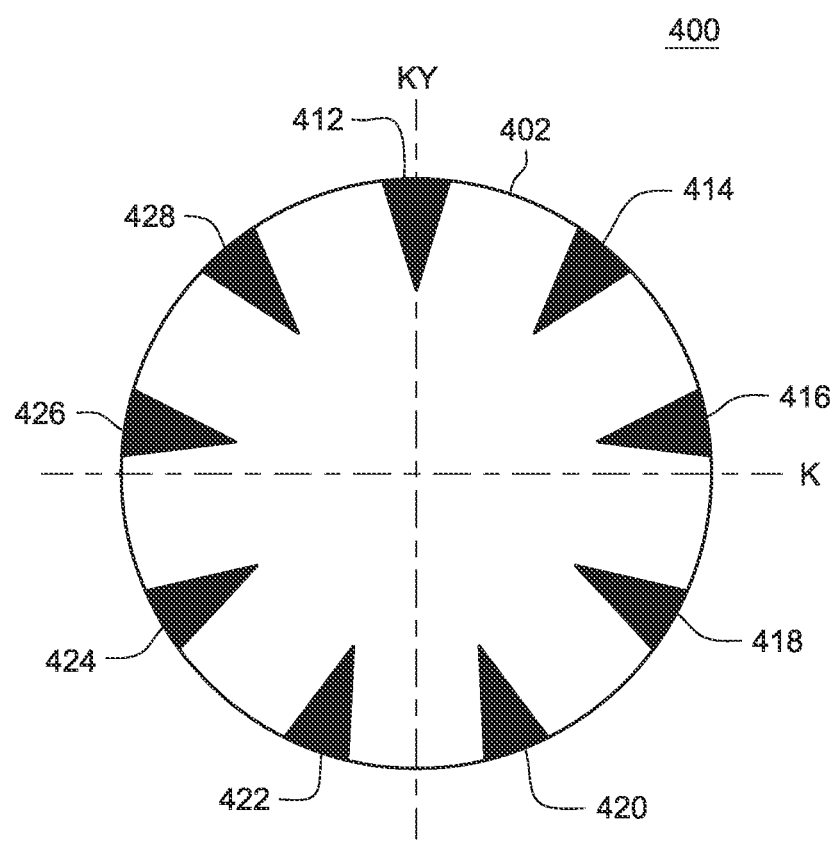
FIG. 4 illustrates a distribution of undersampled areas k-space, according to some embodiments.

According to example embodiments, a data acquisition pattern is determined in which an odd number of angular (e.g., wedge shaped) unsampled areas are arranged at the perimeter of a circular area in k-space corresponding to a scanned area of the patient. In the embodiment shown in FIG. 4, nine angular unsampled areas 412-428 are distributed uniformly around the perimeter of a circular area 402 in k-space. FIG. 4 schematically illustrates how, according to some embodiments, the unsampled (referred to herein also as "undersampled") areas should generally be arranged so that they are distributed around the perimeter of the circular area 402 in a manner that no angular undersampled area is diametrically opposite another angular undersampled area. Each angular undersampled area represents a gap between adjacent radial strips.

Note that FIG. 4 is somewhat stylized. It may not be feasible to gather exactly the sampling pattern as shown, if for example the strips span all the way across the circular k-space, like "diameters" and if strips have simple rectangular shapes. This issue will be addressed subsequently, with realistic feasible sampling patterns, as in FIG. 5 and FIG. 6. FIG. 4 is intended to show basic locations of wedge-like gaps, but not the exact shapes of wedges, and not the correct placement of strips.

When arranged according to some embodiments, at least one of the angular unsampled areas does not have another angular unsampled area at a location such that there exists reflection symmetry of the positions of the two angular unsampled areas with respect to the center of k-space. Some embodiments have no angular unsampled areas such that another angular unsampled area is at a location such that there exists reflection symmetry of the positions of any two angular undersampled areas with respect to the center of k-space. When a plurality of angular unsampled areas are arranged along a perimeter of a k-space area corresponding to a scanned slice of a patient such that none of the angular unsampled areas have another of the angular unsampled areas diametrically opposite to it, a substantially artefact-free image of the slice can be reconstructed because k-space information can be derived to fill in as needed such that no k-space data is fundamentally missing. This virtually complete reconstruction of k-space data is made possible by the Hermitian symmetry properties of k-space. As needed, reconstructions may utilize any of many practical ways to remove most complex phase in the image domain, so that the data becomes essentially Hermitian after the phase removal, as is well known in the art.

Embodiments accelerate scans in PROPELLER or PROPELLER-like techniques by purposefully introducing undersampled sections, and using fewer lines in each radial strip in order to reduce the echo train length (ETL), and/or by using fewer radial strips.

Figure 5:
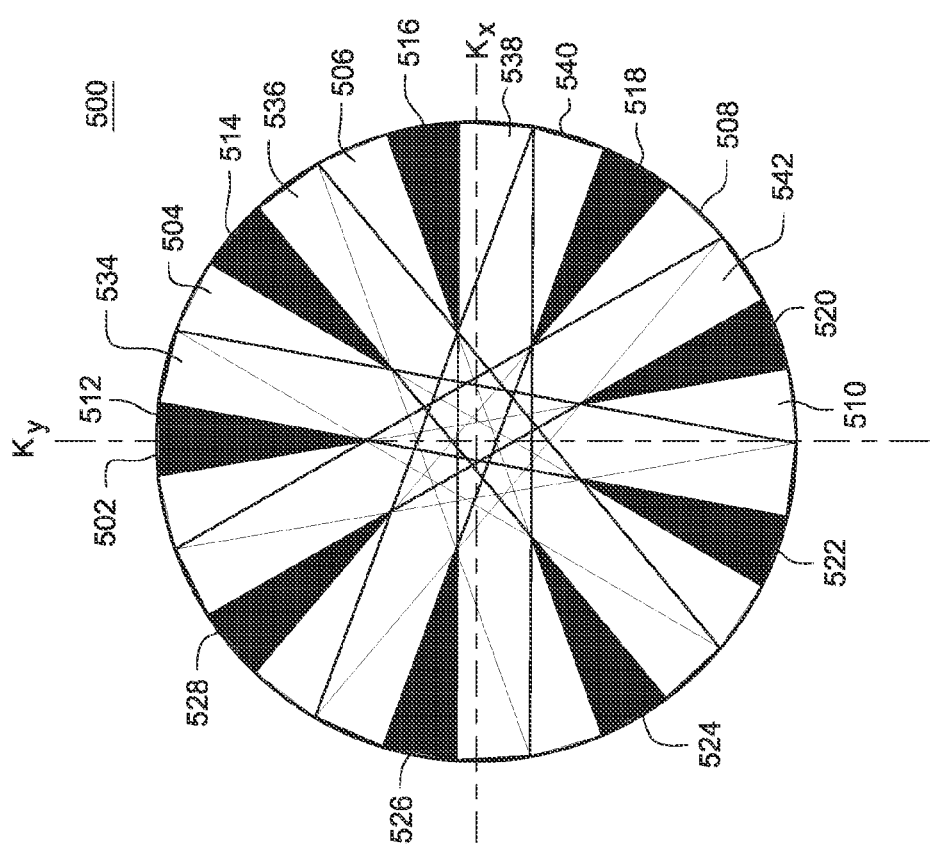
FIG. 5 provides example organization of nine scanning blades such that the undersampled areas correspond to the pattern shown in FIG. 4, according to some embodiments.

FIG. 5 illustrates a technique for determining the data acquisition pattern according to some embodiments. After the desired locations of the undersampled areas have been determined, radial strips of data acquisition can be determined in a manner to fill-in the space between the undersampled areas. According to the technique of FIG. 5, a number of radial strips equal to the number of desired undersampled areas is determined, with the readout direction being in the length-wise direction. Each radial strip may also be made thinner. As illustrated, the undersampled areas are not diametrically opposite each other, but the angular undersampled areas are, in this example, uniformly arranged around the circular area 502. This particular set of constraints, if chosen, implies that the number of strips should be odd.

In a typical embodiment, data for radial strip 504 might be collected in a first TR, data for radial strip 506 in a second TR, and so on, one strip per TR. However it is anticipated that it is also possible that data from more than one TR to contribute to one strip, or conversely, it is also possible that one TR might provide data for more than one strip.

Although in some embodiments the radial strips (as, for example, shown in FIG. 5) are of the same size, other embodiments may have radial strips that are of non-uniform sizes. The dimensions of the radial strips may be determined by the number of lines (e.g., 9-25 lines of data for T2 FSE scans) of data collected in each strip which is in turn related to the number of echoes. The spacing between the lines can be mathematically related to the desired FOV. A rectangular image FOV could provide reason to vary the geometry as the direction of the strip is changed. Likewise, array coils with varying parallel imaging performance in varying directions might also be a reason for vary the geometry of strips as a function of angle.

It is generally desirable that all radial strips in a scan be of the same dimensions, at least for reasons of simpler implementation.

Figure 6:
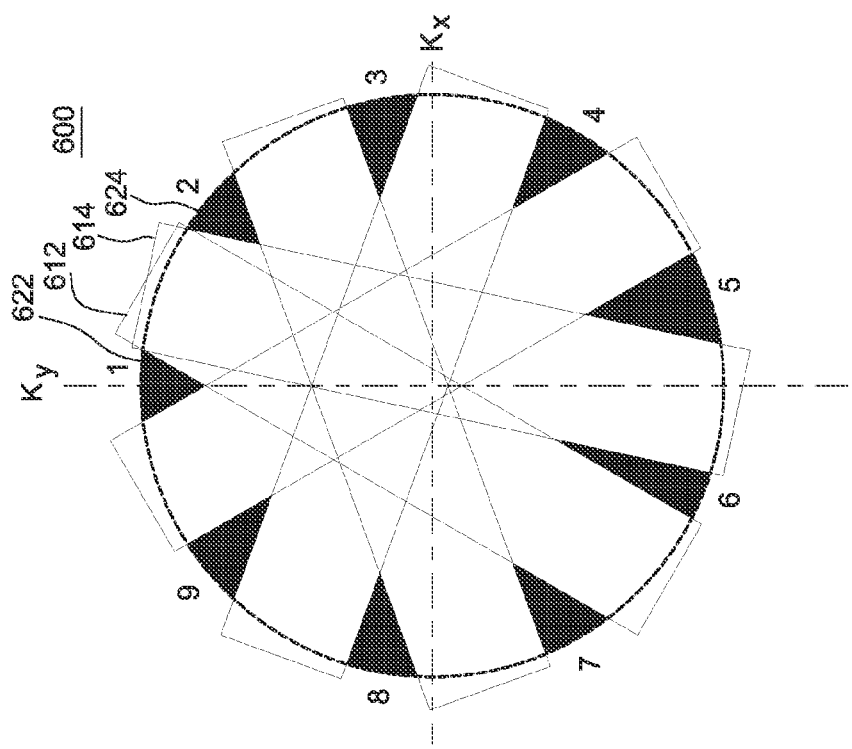
FIG. 6 provides another example organization of five scanning blades such that the undersampled areas correspond to the pattern shown in FIG. 4, according to some embodiments.

FIG. 6 illustrates another technique for determining a data acquisition pattern according to some embodiments. The technique illustrated in FIG. 6 may acquire some extra amount of data using wider strips than used with the technique of FIG. 5. As illustrated in FIG. 6, an example embodiment may use a data acquisition pattern which requires five large blades for accommodating 9 angular undersampled areas. Each large blade shown in FIG. 6 spans the entire area of k-space from one to another of neighboring angular undersampled areas.

As illustrated in FIG. 6, some k-space areas at the perimeter of the circular area may be covered by more than one radial strip. For example, radial strips 612 and 614 overlap in the perimeter of the circular area associated with the radial strip pattern 600 between the angular undersampled areas 622 and 624, causing that section to be collected twice, once for each radial strip 612 and 614. Thus, according to the embodiment illustrated in FIG. 6, the data acquisition coverage is non-uniform. Also, for 2n+1 angular undersampled areas, the technique collects n+1 sampled strips.

Some embodiments introduce undersampled sections and accelerate scans in PROPELLER or PROPELLER-like techniques by using fewer scanned lines in each strip in order to reduce the echo train length (ETL). Consider, for example, that a scan with 230×230 resolution is desired. Then about 360 lines are required to collect the sampled data in accordance with Nyquist properties (e.g., total number of lines=resolution*$\pi$/2).

According to conventional techniques, a scan with 9 strips and no unsampled angular gaps, would require 40 lines per strip in order to obtain 360 lines (lines might all be actually acquired, or maybe parallel imaging allows actual collection of a smaller fraction, with the remaining fraction being mathematically synthesized. Note that the conventional PROPELLER scan is typically performed without unsampled wedge-like gaps, because any such gap may cause streaking artifacts.

Using the embodiment illustrated in FIG. 5, k-space is covered with 9 angular undersampled areas. The angular percentage of peripheral k-space that is unsampled (i.e., a gap percentage) may be configurable to be, for example, 25% missing or 35% missing. If 25% is missing, each pair of thin radial strips must be used to collect 30 lines (instead of 40). Alternatively, instead of a relatively wide blade of 30 lines, two thinner blades of 15 lines each may be used. If the missing portion is 35%, similar determinations would yield 26 lines per wide blade or 13 lines per thinner blade.

Accordingly, in embodiments, the echo train length (ETL) can be made shorter, for shorter TR, or to collect data for more slices per TR, or to experience less T2 decay in one echo train. Alternatively, the inter-echo spacing (IES) can be made longer, perhaps for higher signal to noise ratio (SNR), either for the final reconstruction, or for intermediate calculations such as motion correction estimates. These and/or other trade-offs may be made to control various artifacts. Similar calculations can be made for embodiments described in relation to FIG. 6.

Some embodiments may introduce undersampled areas and accelerate scans in PROPELLER or PROPELLER-like techniques by using fewer strips. For example, in the example described above with respect to the shorter ETL, an embodiment according to FIG. 5 can cover k-space using a smaller number of blades.

As an illustrative example, one may consider decreasing the number of strips from 9 to 7. Then 360/7, or 51.5, lines would be desired per radial strip (This number includes both actually acquired lines, and additional hypothetical lines which would be needed to fill in the wedge-like gaps.). Therefore, if 40 lines are still acquired (e.g., keeping ETL the same), then the gap with each blade has width of about 11.5 lines or 11.5 missing lines. In this case, TR and ETL can be kept the same. Scan time is reduced from 9*TR to 7*TR, which is a 22% reduction in scan time (not including prescan). Similar determinations can be made for embodiments described in relation to FIG. 6.

Of course, engineering tradeoffs can be made in embodiments. For example, the angular undersampled areas can be larger in order to have higher acceleration factors. However, as the undersampled areas are made larger, the center of k-space may get closer to the edge of at least some radial strips, and eventually the ability to correct for some motion errors will be degraded because the oversampling at the central region of k-space is reduced.

Figure 7:
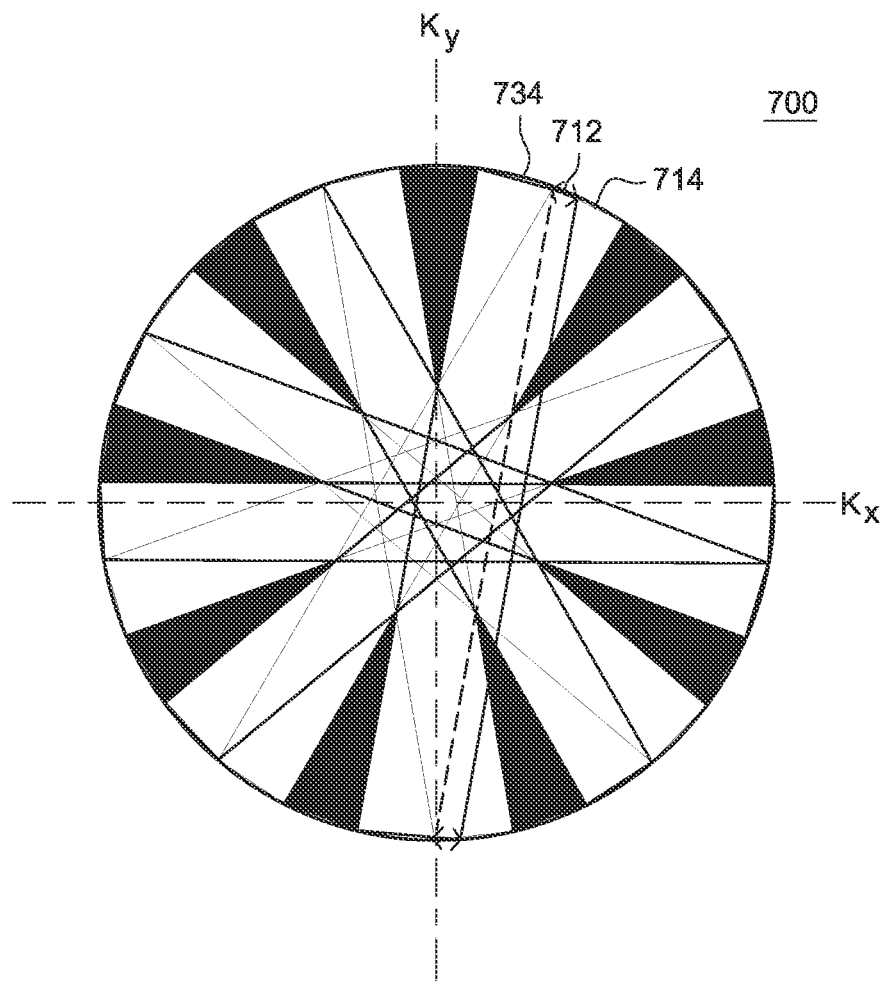
FIG. 7 illustrates a technique of overlapping blades to reduce undersampling due to rotations of the imaging subject, according to some embodiments.

An optional feature is to give back some of the saved scan time, in order to build in some angular overlap (e.g., as opposed to undersampled areas) in the embodiments described in relation to FIG. 5. In the radial strip pattern 500, if the subject rotates in a clockwise pattern during the TR of acquiring radial strip 534, then the motion correction may rotate the radial strip 534 anticlockwise and a new (e.g., that which is not shown in FIG. 5) undersampled area may open up between radial strips 534 and 504 (for example, in the top right of the substantially circular k-space area 502). With a certain amount of overlap of the radial strips, if a strip has motion errors which are less than the overlap amount, then the rotation would not open up a new undersampled area. A motion or rotation of less than the overlap amount may merely cause the radial strip to move such that the overlap is reduced. In other words, angular unsampled areas at some locations, can be beneficially introduced without significant image quality penalty, in exchange for obtaining even better immunity to wider ranges of motion. FIG. 7 illustrates the example arrangement shown in FIG. 5 with one of the pairs of strips overlapped by a certain amount. Thus, whereas the overlap at the center region occurs in all radial strip scan techniques, some embodiments may, in addition, overlap two or more strips at one of the shorter ends of the strips at the periphery of the acquired k-space area.

For example, FIG. 7 illustrates the strip 734 being widthwise extended (compared to strip 534 in FIG. 5) such that strips 734 and 704 overlap for a distance 712 at one of the shorter ends. When such overlap occurs, the scan collects the overlapped area for each of the blades, and therefore may take extra time. However, if the scanned object is rotated by some amount corresponding to less than the distance 712, then no new undersampled areas open up between the two strips 734 and 704, because the motion correction may simply rotate the strip 734 (and/or strip 704) at most until they are flush with each other (touching at the periphery, or separated by no more than the critical Nyquist sampling distance) at the top as shown by strips 534 and 504 in FIG. 5. The amount of overlap (e.g., the distance 712) may be determined as a desired margin of error to correct for motion. Thus, embodiments provide for selectively introducing overlap in order to ensure some level of immunity (or robustness) to motion of the subject.

In the embodiments described above, at least one of the angular unsampled areas did not have another angular undersampled area in a diametrically opposite position in k-space. However, some embodiments are contemplated in which although one or more angular unsampled areas may have another angular unsampled area in the diametrically opposed position, such pairs of angular unsampled areas in diametrically opposed positions are such that one of the undersampled areas of the pair is much larger than the other. As an example, one wedge may have an angular distance at the periphery of k-space which is on the order of three times the angular size of the wedge located at the opposed position. The difference in size may affect how completely the data of the larger unsampled area in k-space may be populated using k-space symmetry techniques (e.g., Hermitian symmetry, complex conjugate) and consequently the amount of artifact caused in the reconstructed image by missing k-space data.

Figure 8:
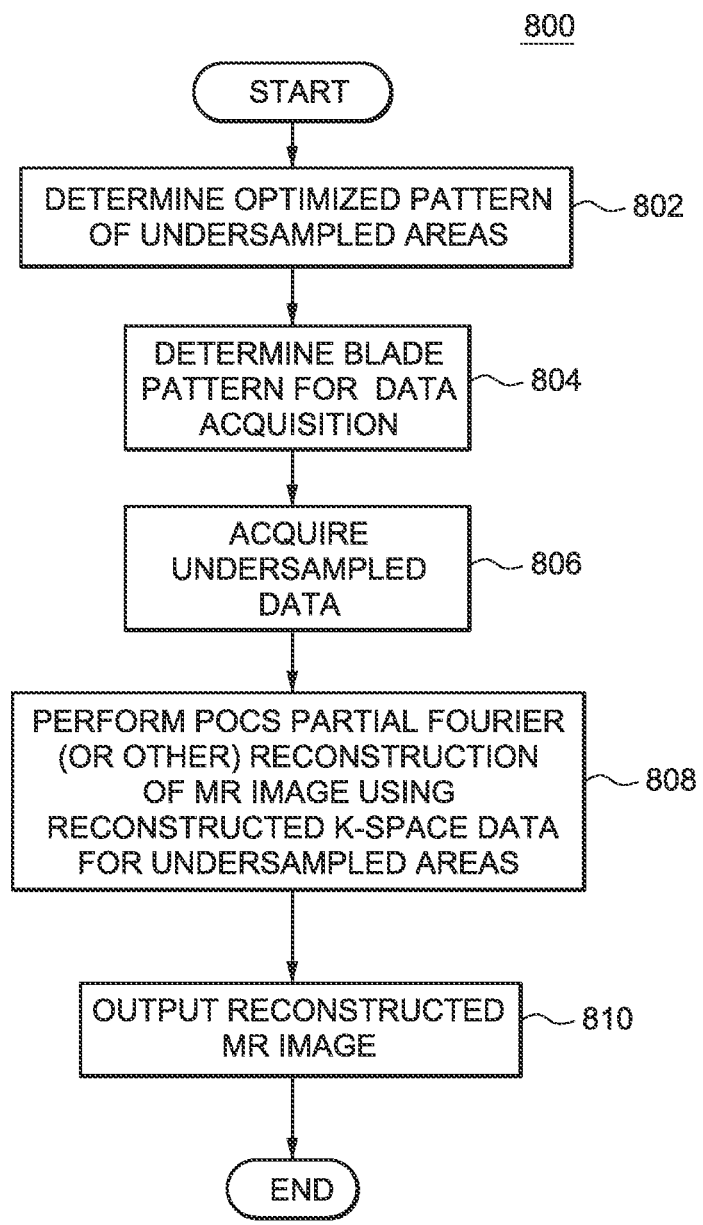
FIG. 8 illustrates a flowchart of a process for acceleration of radial strip scan techniques such as, for example, PROPELLER, having undersampled k-space, in accordance with one or more embodiments.

FIG. 8 illustrates computer program code structure defining a process 800 for acceleration of radial strip scan techniques such as, for example, PROPELLER, having undersampled k-space, in accordance with one or more embodiments. Operations 802-810 may be performed in the order shown or in another order. In some embodiments, one or more operations 802-810 may not be performed, and/or process 800 may include one or more other operations. Process 800 may be performed and/or controlled by MRI data processor 42, MRI system controller 22, and/or MRI sequence controller 30 shown in FIG. 1.

After entering process 800, at operation 802, a pattern of undersampled areas is determined (if not already pre-set). An example pattern of undersampled areas is illustrated in FIG. 4 and is described above.

At operation 804, a radial strip arrangement that accommodates the determined undersampled area pattern is determined (again, if not already pre-set). FIGS. 5-7 illustrate example arrangements of the radial strips, such that an optimized arrangement of the undersampled areas, as determined at operation 802, is achieved.

In some embodiments, flexible trade-offs can be made between how much gap (e.g., size of angular undersampled areas between neighboring radial strips) is generated, and how much overlap is built in. For example, the radial strip arrangement shown in FIG. 5 without overlap at the ends of the respective strips, can be modified as shown in FIG. 7 to form some overlap at the end of the width-direction of at least some of the strips. The angular overlap on one side of k-space corresponds to how much immunity (e.g., range of correction feasible) the reconstruction is to have against, for example, in-plane rotation.

At operation 806, an MRI scan is performed to acquire k-space undersampled data. The MRI scan is performed according to a PROPELLER or PROPELLER-like radial strip scan using the radial strip arrangement determined in the previous steps.

At operation 808, an MR image is reconstructed from the acquired k-space undersampled data. Process 900, described below in relation to FIG. 9, may be used to reconstruct the final reconstructed MR image with negligible artifacts. For example, streaking artifacts that are found in conventional accelerated PROPELLER techniques due to undersampled areas being diametrically opposite each other in k-space, is reduced or eliminated in embodiments. At operation 810, the reconstructed MR image is output. The reconstructed image may be displayed on a display such as display 24, output to a printer such as printer 28, stored in a storage such as, for example, memories 46 or 50, or transmitted over a network to another device for further processing.

Figure 9:
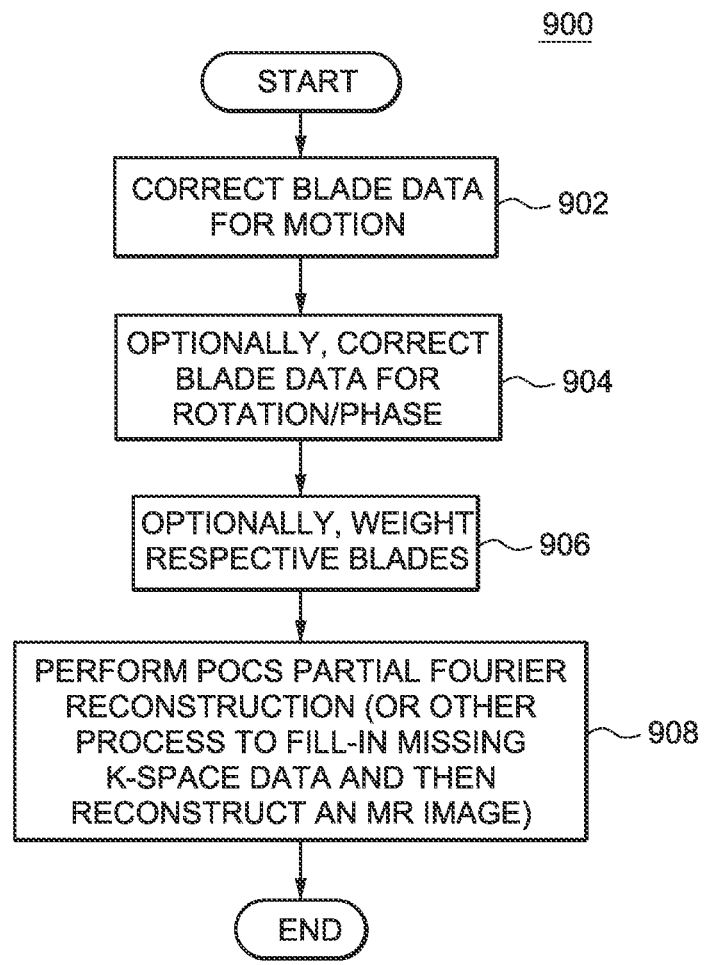
FIG. 9 illustrates a flowchart of a process for MRI reconstruction using undersampled k-space data that may be used with the process of FIG. 8, in accordance with some embodiments.

FIG. 9 illustrates a flowchart of a process 900 for performing image reconstruction from undersampled k-space data at operation 808. Operations 902-908 may be performed in the order shown or in another order. In some embodiments, one or more operations 902-908 may not be performed, and/or process 900 may include one or more other operations. Process 900 may be performed and/or controlled by MRI data processor 42 and/or MRI system controller 22 shown in FIG. 1.

At operation 902, for each radial strip, the acquired k-space data is corrected for motion. As noted above, the oversampling of a central region of k-space is an inherent characteristic of radial strip scan techniques such as PROPELLER. The oversampling of the center region allows for motion correcting each TR or each strip to a standard position. A standard position may be selected, for example, based upon an average of all or a plurality of the radial strips, or based upon any one of the radial strips.

The motion correction may be necessary due to rotation and/or translation of the subject with respect to the scanned area. As noted above, such motion of the subject can change where the undersampled areas are located. Whereas local translational motion is more problematic in diffusion weighted scans, rotational motion is more often a more significant issue in non-diffusion weighted scans. Because every radial strip has a predetermined position with respect to the center of k-space, the acquired k-space data for any radial strip can be translated to its predetermined position by determining how much off center the low-resolution Fourier transformed data has shifted. Simple metrics like calculating centers of mass can suffice, or searching for maximal correlations in the image domain may be used. Likewise, translation in the image domain corresponds to linear phase shifts as a function of locations in k-space, so it is also reasonable to estimate linear fits to complex phase differences of k-space for pairs of strips, for example. Rotation can be detected by features in the acquired data, beyond the center along at least one of the radial axes, either in k-space or in image space. Rotations may be estimated by searching for best fits of data as a function of an angular shift variable along specific circles in k-space, for example. Again, fitting can be done between the data from pairs of strips, or fitting may be done for each strip against some aggregated data, possibly even iteratively (i.e. with successive refinements of the aggregate.)

Alternatively, in some embodiments, the entire k-space may be examined, in k-space or in image space, in order to detect cross-correlations and thereby correct for motion.

At operation 904, optionally, each strip is corrected for another form of phase rotation error. In diffusion imaging, for example, large complex phase deviations can be imposed onto the MR signal due to small motions in the presence of large diffusion gradient lobes in the pulse sequence. This motion-induced error may well follow mathematical models for effects of rigid body translations and rotations, but these major phase errors can come from pixel displacements much less than a single image pixel. Detection and correction of signal phase in the image domain can be corrected in the image domain, often without any positional shift in the image pixel locations. This correction becomes very important when performing high resolution multishot diffusion. Without such correction, complex data cannot be aggregated properly for many shots. Without correction for the complex phase rotations of the image domain pixels, aggregation of the multiple TR shots (i.e. the multiple blades) produces spurious phase cancelation in varying amounts, and varying signal loss or darkening in traditional magnitude images. As in other cases, the estimation of phase errors can be done either in the k-space domain, or in the image domain. Likewise, the correction of phase errors can be done either in the k-space domain, or in the image domain. The operation 904, as shown in FIG. 9, performed on k-space, is a suitable choice for motion which is predominantly rigid body motion. These various alternative corrections are well known now to those in the art.

At operation 906, optionally, the radial strips may be weighted so that the weighting within strips or the weighting between strips can be considered during combining the data corresponding to the strips. The modifying of weights may be performed before the k-space combination and before density compensation to account for one or more of (a) poor quality of correlation, a penalty for through-plane motion etc., or (b) echo quality, such as how far the echo time (TE) is from the desired TE, i.e., to determine by how much the contrast is suboptimal.

Consider the oversampled data in central regions of FIG. 5, FIG. 6, and so on. To reconstruct with the efficient and well-understood FFT/DFT algorithms, one would want to have one sample to use at each grid intersection point on a regularly spaced rectangular Cartesian grid. But in areas of oversampling, multiple data acquired points are available in the immediate vicinity of each ideal sample point location. When the acquired data in a vicinity is aggregated to estimate a single k-space location sample, how should that aggregation be performed? Simply averaging the data is a good approach vis-à-vis signal to noise for random thermal noise. But in PROPELLER imaging, it is likely that one can do better. In PROPELLER, one is often dealing with data which has been altered or "corrupted" by motion. It is reasonable to seek improvement by making preferential use of data which seems to have less motion corruption. A simple approach is to associate a weighting with each available acquired data point in the nearby vicinity if the ideal Cartesian grid sample location. Similarly, different echoes within a single FSE echo train may be determined to be more ideal or less ideal. Higher weighting can be imputed to data from echoes which are more ideal. In portions of the overall acquired k-space area, data will have been supplied only from one strip of data. In areas without redundant data, weighting can be moot. If only one data is close enough to be used, then it should simply be used, regardless of gradations in assumed data quality.

Gridding reconstruction, a standard MR method for reconstructing data acquired with non-Cartesian trajectories, makes use of a weighting function. As acquired samples within a vicinity of an ideal k-space grid point are added into that grid point, each sample is routinely multiplied by or weighted by a function of the distance (in k-space) between acquired sample location and the desired ideal grid point location. This weighting function takes on a functional form of a sinc( ) function, or a sinc( )*window( ) function, where the window function can be something like a Kaiser-Bessel window in signal processing. In the PROPELLER reconstruction it is plausible to combine this gridding weighting value with yet other weighting information. In particular, the gridding weighting value for a pixel can be multiplied with another weighting function related to data quality consistency between shots, or with another weighting function which penalizes data from less ideal echo times, or with both of these further weighting functions.

One simple but practical indicator of data quality can be the value of the k-space data, or the absolute magnitude of the value of the k-space data, at the central location of k-space. This indicator could be evaluated after k-space corrections for in-plane translation motion. Variation of such a central k-space value can be an indicator of signal cancelation due to significant non-rigid-body motion during diffusion weighted scanning. Likewise, such variation can be associated with changes in the imaging slice, from translations along the perpendicular of the imaging plane, or rotational tilts of the imaging plane. [Note, of course, these changes of the imaging slice are not relative to the mechanical coordinates of the MRI hardware system, but rather they are relative to the intended slice and coordinate of the object of interest, perhaps a slice in a human subject's brain. While it is commonplace to speak, for example, of "a correction for an in-plane rotation of a slice . . . ," this mathematical correction may be arising in the physical world from "an in-plane rotation of the anatomy of interest . . . ," (the anatomy having rotated in the opposite direction).]

An example of such a weighting function, in this case an indicator of some inconsistencies for entire strips, can be as follows:

$$\text{diff}(\text{strip}) = ABS(k0(\text{strip}) - k0(\text{aggregate})) \tag{1}$$

$$\text{relative}_{\text{diff}}(\text{strip}) = \text{diff}(\text{strip})/ABS(k0(\text{aggregate})) \tag{2}$$

$$\text{weight}(\text{strip}) = SQR(\text{MAX}(\text{relative}_{\text{diff}}(\text{strip}), 0)) \tag{3}$$

Such a weight returns a value in the range of 0 to 1. Equations (1)-(3) above illustrate, determining a difference value for the strip as the absolute value of the difference in value between k-space center region of that strip and a k-space center region aggregate for all strips, determining a relative difference value for that strip based upon the ratio of the difference value of that strip to the absolute value of the k-space center region aggregate for all strips. Then the weight for that strip can be the square of the relative difference value for that strip.

Each data acquisition line in a radial strip corresponds to a respective echo. In general, for any particular radial strip, a data line at its width-wise center (e.g., long axis) may be regarded as having the most accurate data by virtue of exhibiting the T2 contrast typical of the larger and dominant features in the image. Thus, the lines may be assigned weights to reflect the center line as having the highest weight, and the respective weights gradually decreasing for lines as they are away from the line at the width-wise center. This penalizes data which has less ideal relaxation contrast. A relatively simple example of such a weighting function can be $$Wecho = ABS(TE - TEcenter)/(\alpha * TEmax) \qquad (4)$$

where "a" is a free design parameter with a value chosen to be greater than 1.0. Equation (4) illustrates a weight for an echo being determined as the ratio between the absolute difference between the TE of the echo and the TE of the k-space center region, and the maximum TE.

When weights are assigned to data lines or strips in overlapped areas, the value for each k-space position may be determined by a weighted average of the corresponding values from respective strips overlapping that location. In particular, at an ideal grid point location, data can be chosen for use at that grid point with steps such as:

For each sample (s, k_loc_acq), in a vicinity of k_loc_grd)
    Compute weight_grids, k_loc_acq, k_loc_grid)
    Compute weight_echo(s, k_loc_acq)
    Compute weight_strip(s)
    Compute
      weight=weight_grid*weight_echo*weight_strip
    Accumulate sig_total (k_loc_grd)+=weight*k(s, k_loc_acq)
    Accumulate weight_total(k_loc_grd)+=weight
EndFor
sig_final(k_loc_grd)=sig_total(k_loc_grd)/weight_total (k_loc_grd)

In the pseudocode above, "s" denotes choice of a strip, "k_loc_grd" is the grid point location for which a value is being computed, "k_loc_acq" is an acquired sample point location of a sample being used for computing accumulated signal ("sig_total( )") and accumulated weight ("weight_total( )") in a particular iteration, and "sig_final( )" is the final value for k_loc_grd.

According to some embodiments, even with the weighting, it may be helpful to require the data to confirm to some standard. For example, if a radial strip, in a particular TR, acquires data for a slice different from the intended slice (due to major patient motion in the direction perpendicular to the imaging slice) then, even after motion correction is performed, in some cases, the values may still be very different from the standard. Either the weights may be adjusted in the event that such discrepancies are detected, or such data can be ignored. Ignoring data can be accomplished within a weighting step, by using a weighting factor of 0.0. Data threshold values for determining whether acquired data is sufficiently close to a standard may be determined using any of several techniques. As one example, if a strip has a maximal k-space data amplitude which is less than 0.5 times the maximal data space amplitude of the first averaged aggregated k-space, then the weighting of that particular strip might become zero.

At operation 908, partial Fourier reconstruction is performed using the acquired data after being processed by one or more of operations 902-906. Any of several partial Fourier techniques, such as, for example, the homodyne technique, the Margosian technique, or POCS. The homodyne technique makes use of low pass filtering of images, usually in image space. Alternately, the Margosian technique can be applied, making use of window functions in aggregated k-space. Alternately, the POCS technique for partial Fourier reconstruction can be performed on combined data-set for all radial strips (after each radial strip has independently been corrected for motion).

The application of the POCS technique may begin with the acquired data before the undersampled areas are filled in. The motion corrections and other corrections may already have been performed for each radial strip. The POCS technique first transforms acquired data, with the undersampled areas zeroed, to the image space (e.g., real space). The images obtained at this stage may have flaws, for example, due to the unfilled areas of k-space. Filtering of the complex valued (R+jI) data may be performed, such as a low-pass phase filter. (Further processing, such as enforcing non-negativity of the pixel signals is possible.) This predominantly smooth-phase signal R is subtracted from the unfiltered images noted above. These subtracted images will, in practice, contain major fractions of the image artefact from undersampling, but small fractions of the desired correct signal.

The subtracted image result is reverse transformed into k-space, and is combined with the originally acquired k-space data to provide a "completely filled" k-space from which the reconstructed image is then obtained by suitable Fourier transform reconstruction.

Under some conditions, use of the POCS algorithm concepts to perform Fourier reconstruction upon k-space with missing data simplifies to be basically the older discrete Gerchberg-Papoulis signal processing method. These partial-Fourier algorithms are well known in MRI technical literature.

It will be noted, that according to at least some embodiments, the partial Fourier reconstruction is performed on the combined acquired data from plural strips. In contrast, some conventional techniques perform comparable partial Fourier reconstruction for each strip before the data is combined. Advantages of performing partial Fourier reconstruction can include (1) available signal to noise on the aggregated data, (2) larger areas of available data in the aggregates for improved phase filtering, and (3) data which is of higher overall quality in the aggregate due to selective weighting among oversampled parts of the data, all three of which methods may improve image quality.

Example embodiments provide several advantages over conventional PROPELLER and PROPELLER-like techniques. For example, faster scans are provided at similar or the same image quality. Moreover, the resulting sampling patterns and strip overlap patterns can have better immunity to undersampling artifacts induced by in-plane rotational motion. Also, partial Fourier reconstruction on combined data, according to example embodiments, yields larger central areas of fully sampled data than techniques which perform the partial Fourier reconstruction on each blade. Larger central areas of fully acquired data can yield reconstructions in areas of images where the correct signal phase exhibits higher spatial frequency content.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system comprising:
   an MRI gantry including a static magnetic field coil, gradient magnetic field coils, at least one radio frequency (RF) coil coupled to an imaging volume, RF transmitter and receiver circuits coupled to said at least one RF coil and configured to receive NMR echo signals from an object located in the imaging volume; and
   at least one control computer circuit connected to control said gradient magnetic field coils, and said RF transmitter and receiver circuits so as to:
   acquire k-space data for a data acquisition pattern which comprises strips leaving at least one undersampled area therebetween that does not have another undersampled area in a diametrically opposed position of k-space;
   generate a magnetic resonance (MR) image from the acquired k-space data; and
   output the generated MR image.

2. The MRI system according to claim 1, wherein the acquiring the k-space data comprises, for each of the strips, a plurality of parallel lines of the acquired k-space data extending across a center region of k-space.

3. The MRI system according to claim 1, wherein there are at least two undersampled areas that do not have an undersampled area located diametrically opposite to them.

4. The MRI system according to claim 1, wherein there are a plurality of undersampled areas and none of the plurality of undersampled areas has an undersampled area located diametrically opposite to it.

5. The MRI system according to claim 1, wherein the at least one control computer circuit effects generation of the MR image by:
   combining the acquired k-space data from each of the strips; and
   generating the image with a reconstruction such that the sampled k-space data at locations diametrically opposed in k-space to locations of undersampled data is used to substantially prevent undersampling artifacts in the image, said undersampling artifacts being typical of zero-filled Fourier reconstruction.

6. The MRI system according to claim 5, wherein the at least one control computer circuit, before generating the MR image: sets, for each of the strips, a motion estimate, and uses the set motion estimate to correct the acquired k-space data for at least one of (a) phase or (b) rotation, and performs the combining using the corrected k-space data-.

7. The MRI system according to claim 5, wherein the at least one control computer circuit, before generating the MR image: assigns a weight to each of the strips to account for at least one of (a) a quality of correlation of the acquired k-space data for each of the strips to others of said strips in an oversampled area and (b) a penalty for through-plane motion, and performs the combining using the assigned weights.

8. The MRI system according to claim 5, wherein the at least one control computer circuit, before generating the MR image:
   assigns a weight to each line to account for echo quality of said each line in relation to other lines, and
   performs the combining using the assigned weights.

9. The MRI system according to claim 8, wherein the assigned weight for said each line is determined in accordance with variation of echo contrast among two or more lines in an oversampled area.

10. The MRI system according to claim 1, wherein the strips are arranged such that at least one of the strips overlaps another of the strips at the perimeter of a predetermined area in k-space.

11. The MRI system according to claim 1, wherein the strips are arranged such that each of the strips overlaps at least another of the strips at the perimeter of a predetermined area in k-space.

12. The MRI system according to claim 11, wherein an amount of said overlap is determined in accordance with a desired level of tolerance for motion of the object.

13. The MRI system according to claim 1, wherein the strips are arranged radially in k-space with respective angles of separation that are non-uniform between pairs of the strips.

14. The MRI system according to claim 1, wherein at least one of the strips is shifted with respect to a center of k-space.

15. The MRI system according to claim 14, wherein each of the strips is shifted by an offset from the center of k-space that alternates at least in a shorter axis direction of each of the strips.

16. The MRI system according to claim 1, wherein the strips consists of an odd number.

17. The MRI system according to claim 16, wherein angular undersampled areas are substantially uniformly positioned over 360 degrees at the perimeter of a substantially circular area in k-space.

18. The MRI system according to claim 1, wherein the acquiring of the k-space data is performed using a PROPELLER scan.

19. The MRI system according to claim 1, wherein the receiving of the NMR echo signals are refocused RF echoes from a Fast Spin Echo pulse sequence.

20. A method of imaging by use of magnetic resonance, said method comprising:
   operating a magnetic resonance imaging (MRI) system including a static magnetic field coil, gradient magnetic field coils, at least one radio frequency (RF) coil coupled to an imaging volume, RF transmitter and receiver circuits coupled to said at least one RF coil and configured to receive nuclear magnetic resonance (NMR) spin echo RF signals from an object located in the imaging volume, and at least one control computer circuit connected to control said gradient magnetic field coils and said RF transmitter and receiver circuits to effect:
   acquiring, by the at least one control computer circuit controlling said gradient magnetic field coils and said RF transmitter and receiver circuits, k-space data for a data acquisition pattern which comprises a plurality of strips leaving at least one undersampled area therebetween that does not have another undersampled area in a diametrically opposed position of k-space;
   generating a magnetic resonance (MR) image from the acquired k-space data; and
   outputting the generated MR image.

* * * * *